(12) United States Patent
Borth et al.

(10) Patent No.: US 12,334,375 B2
(45) Date of Patent: Jun. 17, 2025

(54) SPINDLE ASSEMBLY FOR WAFER TRANSFER IN A MULTI-STATION PROCESS MODULE

(71) Applicant: Lam Research Corporation, Fremont, CA (US)

(72) Inventors: Andrew Borth, Newberg, OR (US); Jeremy Pool, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 353 days.

(21) Appl. No.: 17/632,758

(22) PCT Filed: Aug. 7, 2020

(86) PCT No.: PCT/US2020/045359
§ 371 (c)(1),
(2) Date: Feb. 3, 2022

(87) PCT Pub. No.: WO2021/026430
PCT Pub. Date: Feb. 11, 2021

(65) Prior Publication Data
US 2022/0262662 A1 Aug. 18, 2022

Related U.S. Application Data

(60) Provisional application No. 62/884,635, filed on Aug. 8, 2019.

(51) Int. Cl.
*H01L 21/677* (2006.01)
*H01L 21/67* (2006.01)
*H01L 21/687* (2006.01)

(52) U.S. Cl.
CPC .... *H01L 21/67706* (2013.01); *H01L 21/6719* (2013.01); *H01L 21/68792* (2013.01); *H01L 21/67742* (2013.01); *H01L 21/67748* (2013.01)

(58) Field of Classification Search
CPC .......... H01L 21/67706; H01L 21/6719; H01L 21/68792; H01L 21/67742; H01L 21/67748
See application file for complete search history.

(56) References Cited

U.S. PATENT DOCUMENTS 3,645,460 A  2/1972  Scaffidi
6,007,675 A  * 12/1999  Toshima ................. C23C 16/54
                                              134/52

(Continued)

FOREIGN PATENT DOCUMENTS

CN  107641797 A  1/2018
JP  H09503349 A  3/1997

(Continued)

OTHER PUBLICATIONS

ISR & Written Opinion PCT/US2020/045359, dated Nov. 24, 2020, 9 pages.

(Continued)

*Primary Examiner* — Mark C Hageman
*Assistant Examiner* — Ashley K Romano

(57) ABSTRACT

A spindle assembly for transferring wafers in a multi-station process module is provided, including: a hub body, the hub body configured to be rotated about a center axis; a plurality of end effectors, each end effector having a first end configured for connection to the hub body and a second end configured to support a wafer; a plurality of covers; a plurality of fastener assemblies; wherein the first end of each end effector is clamped between a respective cover and a respective outer portion of the hub body by a respective fastener assembly, the respective fastener assembly including a wave spring that provides a consistent clamping force.

14 Claims, 14 Drawing Sheets

(56) References Cited

U.S. PATENT DOCUMENTS

| | | | |
|---|---|---|---|
| 6,200,415 | B1 | 3/2001 | Maraschin |
| 6,328,096 | B1 * | 12/2001 | Stone ................ H01L 21/68792 |
| | | | 269/21 |
| 10,109,517 | B1 * | 10/2018 | Blank ................ H01L 21/67742 |
| 2018/0211864 | A1 * | 7/2018 | Nordin ............... H01L 21/67742 |
| 2021/0375650 | A1 * | 12/2021 | Satyavolu ......... H01L 21/67196 |
| 2022/0126386 | A1 * | 4/2022 | Dekervel ........... B23K 35/0244 |

FOREIGN PATENT DOCUMENTS

| | | | |
|---|---|---|---|
| JP | H11163075 | A | 6/1999 |
| JP | 2001500320 | A | 1/2001 |
| JP | 2003257958 | A | 9/2003 |
| JP | 2008227491 | A | 9/2008 |
| JP | 2012204828 | A | 10/2012 |
| JP | 2015008203 | A | 1/2015 |
| JP | 2015534120 | A | 11/2015 |
| JP | 2018139287 | A | 9/2018 |
| JP | 2019519913 | A | 7/2019 |
| JP | 2022529909 | A | 6/2022 |
| KR | 20070063405 | A | 6/2007 |
| KR | 20140007091 | A | 1/2014 |
| KR | 101383062 | B1 | 4/2014 |
| KR | 20190086657 | A | 7/2019 |
| WO | WO-2019140057 | A1 | 7/2019 |

OTHER PUBLICATIONS

Chinese Office Action for Chinese Application No. 202080056242.6 dated Oct. 23, 2024.

Japanese Decision to Grant a Patent for Japanese Application No. 2022-507577 dated Sep. 6, 2024.

Japanese Notice of Reasons for Refusal for Japanese Application No. 2022-507577 dated May 31, 2024.

Korean Decision for Grant of Patent for Korean Application No. 10-2022-7007697 dated Oct. 26, 2023.

Korean Office Action for Korean Application No. 2024-7003098 dated Nov. 12, 2024.

* cited by examiner

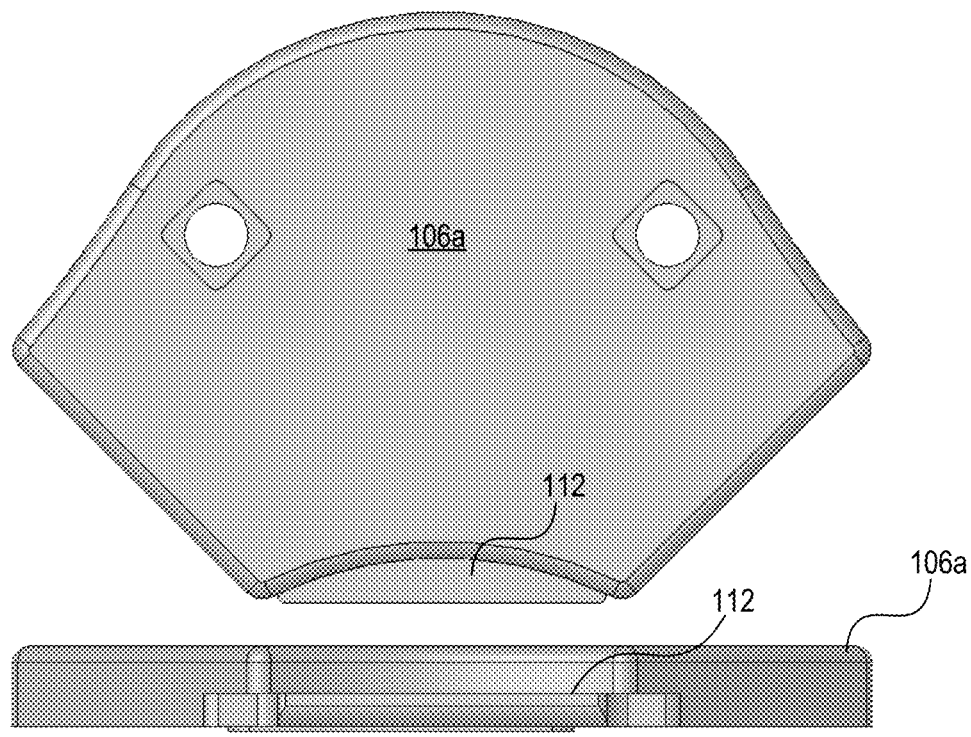
FIG. 4A
FIG. 4B
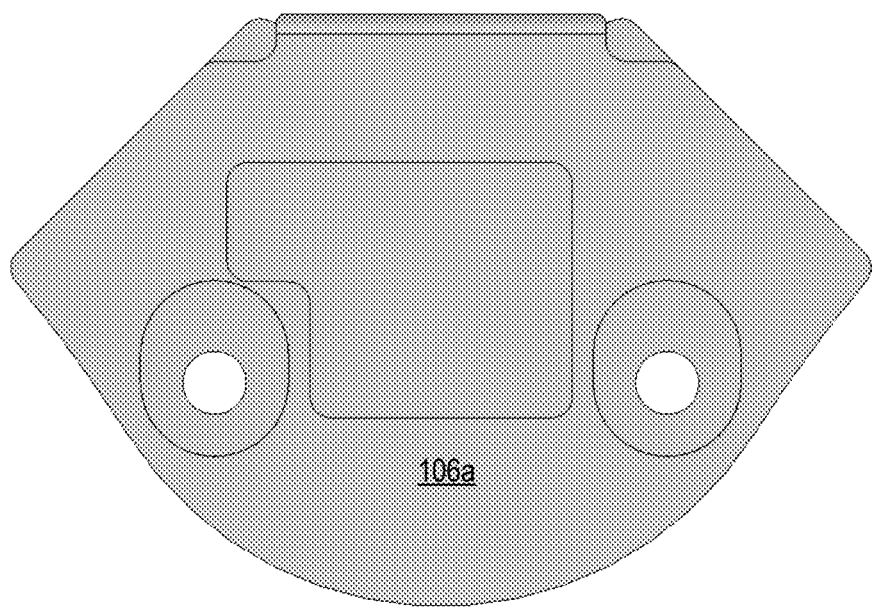
FIG. 4C

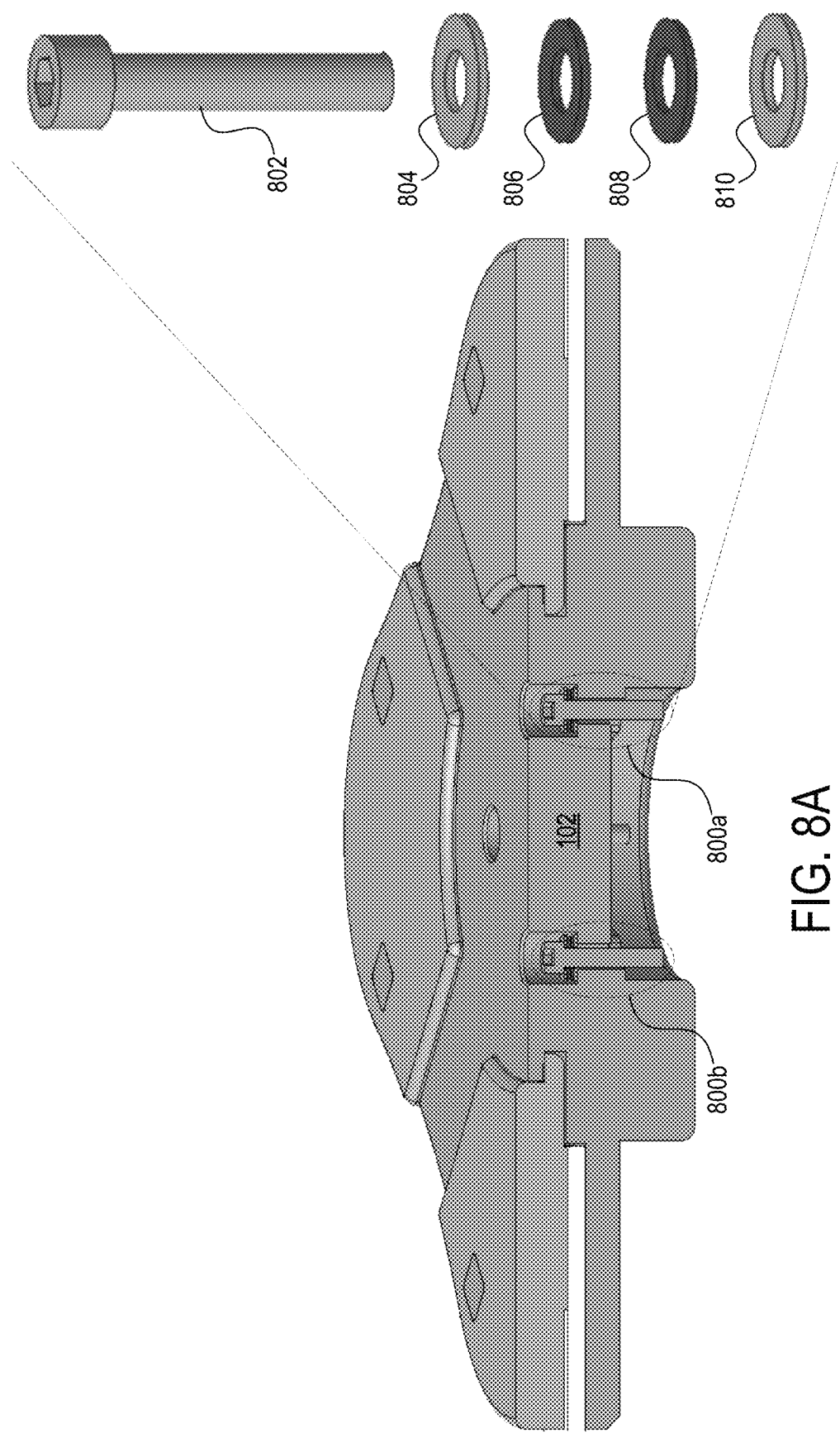

SPINDLE ASSEMBLY FOR WAFER TRANSFER IN A MULTI-STATION PROCESS MODULE

This application is a national stage filing of and claims priority, under 35 U.S.C. § 371, to PCT/US2020/045359, filed on Aug. 7, 2020, and titled "SPINDLE ASSEMBLY FOR WAFER TRANSFER IN A MULTI-STATION PROCESS MODULE", which claims the benefit of and priority, under 35 U.S.C. § 119(e), to U.S. Provisional Patent Application No. 62/884,635, filed on Aug. 8, 2019, and titled "SPINDLE ASSEMBLY FOR WAFER TRANSFER IN A MULTI-STATION PROCESS MODULE", the disclosures of which are incorporated by reference herein in their entirety.

BACKGROUND

1. Field of the Invention

The present embodiments relate to structures used in semiconductor processing tools, and in particular, to a spindle assembly that is used for supporting and transferring semiconductor wafers in a multi-station process module.

2. Description of the Related Art

In wafer processing, process modules can have multiple process stations, such as in quad station process modules manufactured by Lam Research Corporation. Such multi-station process modules may employ a spindle assembly to transfer wafers from one station to another. Broadly speaking, such a spindle assembly includes a number of paddles extending from a central hub, wherein the paddles support the wafers during transfer.

It is in this context that implementations of the disclosure arise.

SUMMARY

Implementations of the disclosure provide systems, apparatuses, and methods that employ a spindle assembly that supports wafers during transfer in a multi-station process module.

A spindle assembly is disclosed which prevents loosening of components that are used to attach ceramic end effectors to the spindle hub.

Existing designs use fasteners alone to clamp the end effectors, which can loosen due to high operating temperatures. However, in accordance with implementations of the disclosure, a spindle assembly is provided using a barrel nut with a wave spring to decouple the fastener torque from clamping force, and provide an order of magnitude more compliance for thermal expansion. The novel use of a wave spring and interlocking geometry to secure the ceramic end effector is herein disclosed, enabling a much higher operating temperature with lower maintenance intervals (which are needed with existing designs in order to re-torque loosening fasteners).

Other aspects and advantages of the invention will become apparent from the following detailed description, taken in conjunction with the accompanying drawings, illustrating by way of example the principles of the invention.

BRIEF DESCRIPTION OF THE DRAWINGS

FIG. 4A illustrates a top view of the cover 106a, in accordance with implementations of the disclosure.

FIG. 4B illustrates a side view of the cover 106a, in accordance with implementations of the disclosure.

FIG. 4C illustrates a bottom view of the cover 106a, in accordance with implementations of the disclosure.

FIG. 8A illustrates a cutaway perspective view of the hub body, in accordance with implementations of the disclosure.

FIG. 8B illustrates an expanded perspective view of the components of a spindle fastener assembly, in accordance with implementations of the disclosure.

DESCRIPTION

Embodiments of the disclosure provide various details of a spindle assembly that is used in a process chamber. The spindle assembly may be used in a process chamber that includes multiple stations for processing, including multiple pedestals or chucks. In one configuration, if the process chamber includes a set of pedestals, the spindle assembly will have an equivalent number of end effectors, such that the system may simultaneously transfer all wafers, e.g., by a rotating assembly. In this manner, all wafers are transferred to a different pedestal to enable further processing in the process chamber. It should be appreciated that the present embodiments can be implemented in numerous ways, such as a process, an apparatus, a system, a device, or a method. Several embodiments are described below.

A wafer processing system includes one or more chambers or "reactors" that are suitable for wafer processing. Each chamber may include multiple stations to house one or more wafers for processing. The one or more chambers maintain the wafer in a defined position or positions (with or without motion within that position, e.g. rotation, vibration, or other agitation). A wafer undergoing processing (e.g. deposition, etch, clean, etc.) may be transferred into and out of the reactor chamber and from one station to another within a reactor chamber during processing. Of course, the processing may occur entirely at a single station or any fraction of the processing may be performed at any number of stations.

Figure 1A:
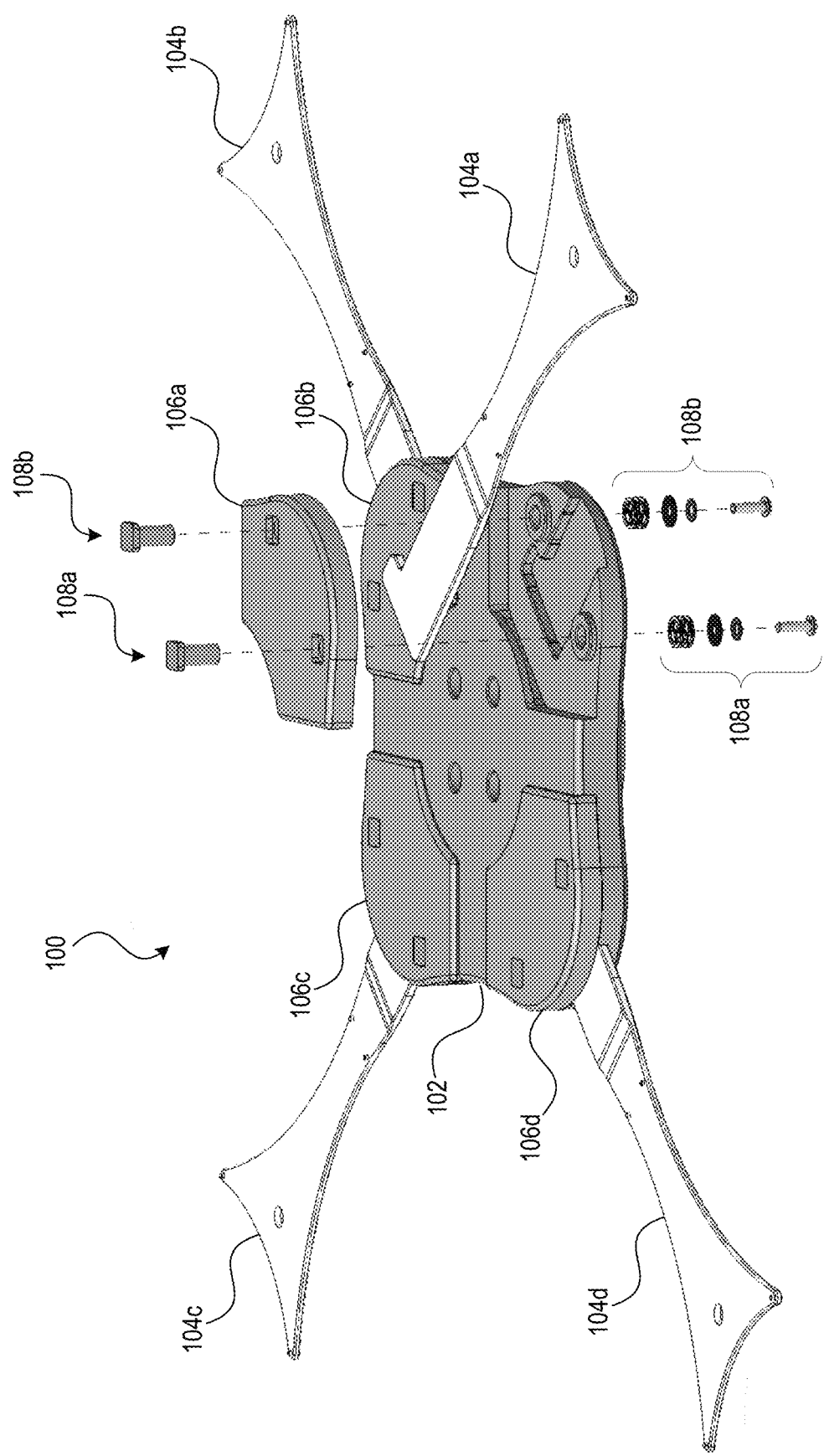
FIG. 1A illustrates perspective view of a spindle assembly, in accordance with implementations of the disclosure.

FIG. 1A illustrates a perspective view of a spindle assembly 100, in accordance with implementations of the disclosure. The spindle assembly 100 includes a hub body 102, to which several end effectors 104a, 104b, 104c, and 104d are attached. When attached, the end effectors radiate outwards from the hub body 102. The end effectors support wafers within a multi-station process module, and are used to lift and transfer wafers from one station to another station. While in the illustrated implementation of the spindle assembly there are specifically four end effectors, it will be appreciated that in other implementations there can be one or two or more end effectors. For ease of description throughout the present disclosure, componentry is described with respect to a particular portion or end effector of the spindle assembly, and it will be appreciated that such also applies to corresponding other portions or end effectors of the spindle assembly. Thus, it will be appreciated that components/configurations are provided in duplicate to enable configuration of the spindle assembly with a given number of end effectors, though for purposes of brevity such duplicate components/configurations may not all be specifically described or shown.

The end effectors 104a, 104b, 104c, and 104d are secured to the hub body 102 by covers 106a, 106b, 106c, and 106d, respectively, as the covers are fastened to the hub body. That is, each end effector is clamped between the hub body 102 and a corresponding cover, when the cover is fastened to the hub body by a fastener assembly. For example, in the illustrated implementation the cover 106a is secured to the hub body 102 by fastener assemblies 108a and 108b, thereby clamping the end effector 104a in place between the hub body 102 and the cover 106a.

Figure 1B:
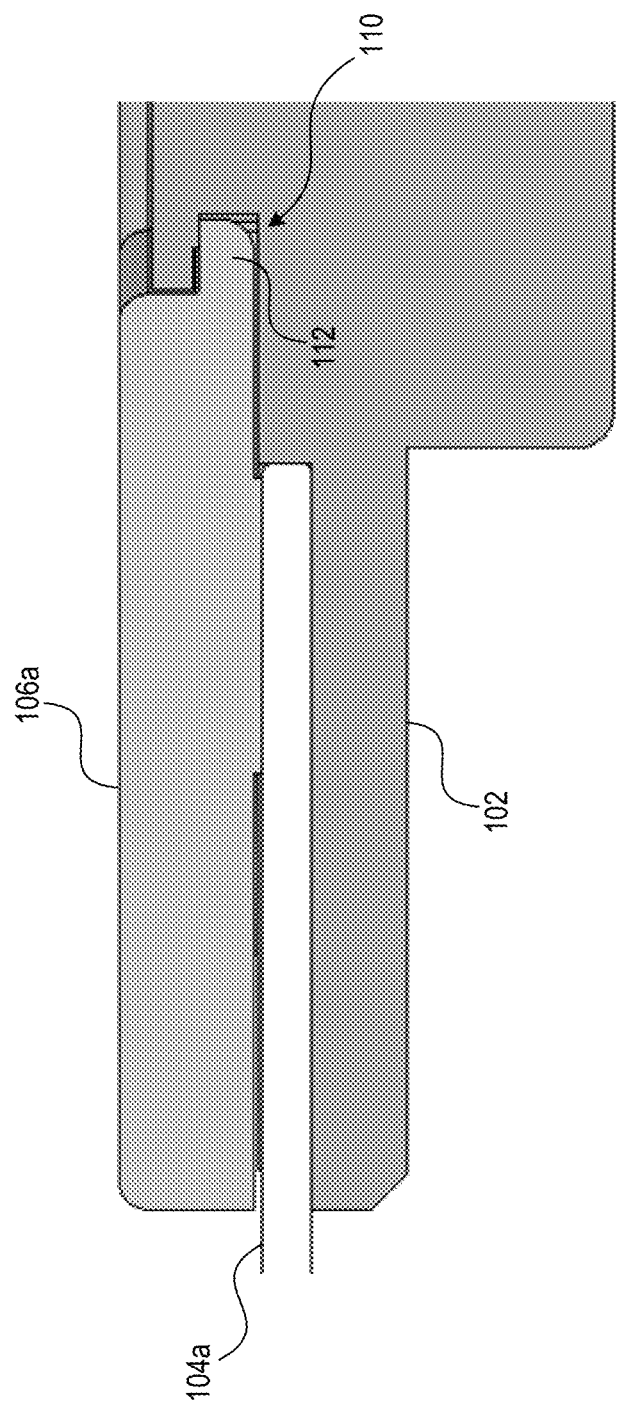
FIG. 1B illustrates a radial cross-section view of a portion of the spindle assembly 100, in accordance with implementations of the disclosure.

FIG. 1B illustrates a radial cross-section view of a portion of the spindle assembly 100, in accordance with implementations of the disclosure. In the illustrated implementation, a radial cross-sectional portion which includes the cover 106a and the end effector 104 is shown. As shown, the internal end of the end effector 104a, is clamped between the cover 106a and the underlying portion of the hub body 102. Also shown is an undercut portion 110 of the hub body, which forms a groove or recess or slot into which a lip 112 of the cover 106a fits. This fitment, which is akin to a tongue-and-groove type mechanism, vertically secures the internal end of the cover 106a to the hub body 102, thereby enabling the clamping of the end effector 104a.

Figure 2A:
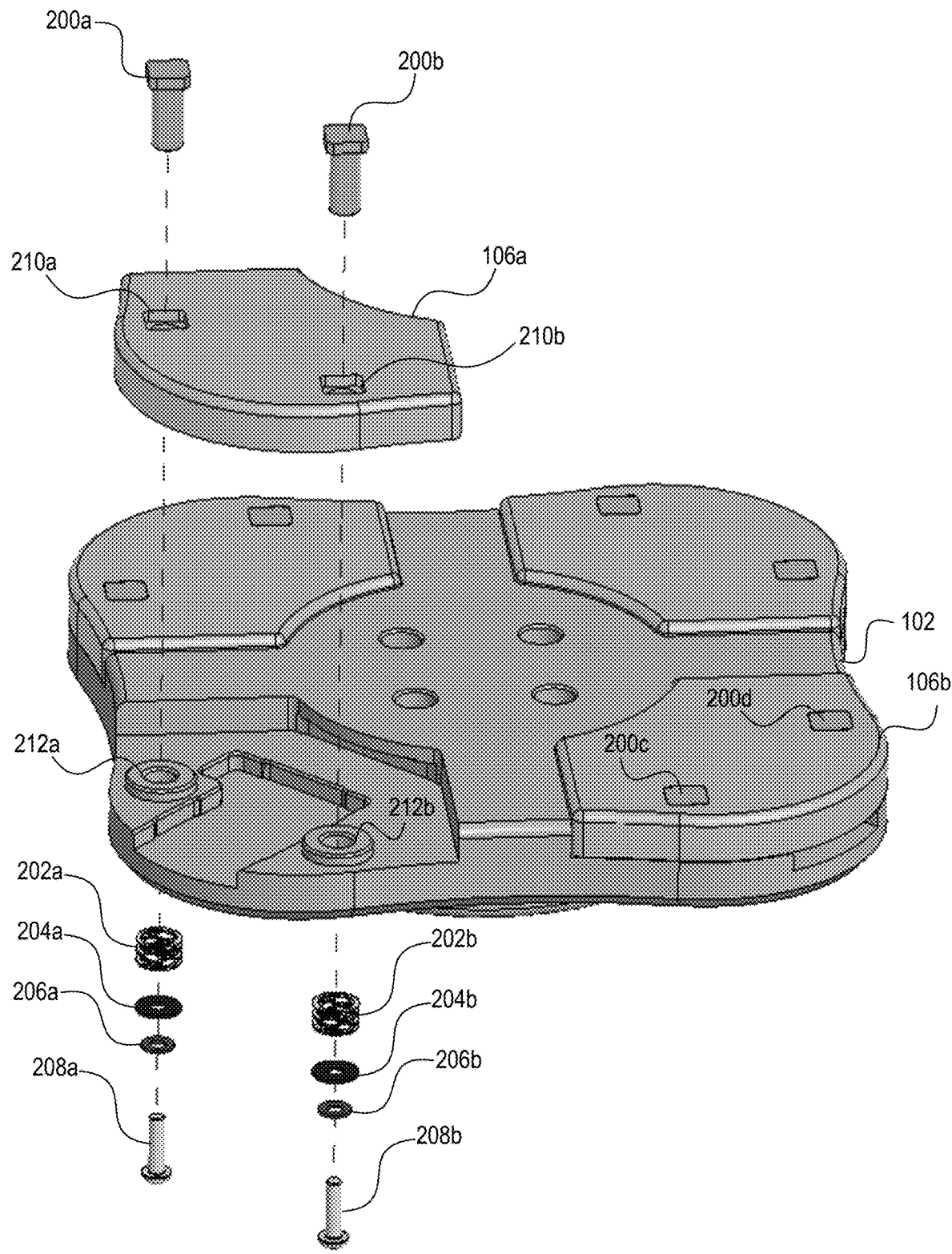
FIG. 2A illustrates a perspective view of the hub body 102 and cover 106a, and further showing the fastener assembly, in accordance with implementations of the disclosure.

FIG. 2A illustrates a perspective view of the hub body 102 and cover 106a, and further showing the fastener assembly, in accordance with implementations of the disclosure. The fastener assemblies 108a and 108b are shown, each including several components that function to secure the cover 106a to the hub body 102. The fastener assembly 108a includes a barrel nut 200a, a wave spring 202a, a fender washer 204a, a Belleville washer 206a, and a screw 208a that screws into the barrel nut 200a. The fastener assembly 108b includes a barrel nut 200b, a wave spring 202b, a fender washer 204b, a Belleville washer 206b, and a screw 208b that screws into the barrel nut 200b.

The barrel nut 200a extends through a throughhole 210a in the cover 106a and a corresponding throughhole 212a in the hub body 102. The barrel nut 200b extends through a throughhole 210b in the cover 106a and a corresponding throughhole 212b in the hub body 102.

While cover 106a and its attendant fastener assemblies are shown in detail, it will be appreciated that the other covers are secured in a similar manner via respective fastener assemblies. For example, cover 106b is secured to the hub body 102 by fastener assemblies including barrel nuts 200c and 200d.

Figure 2B:
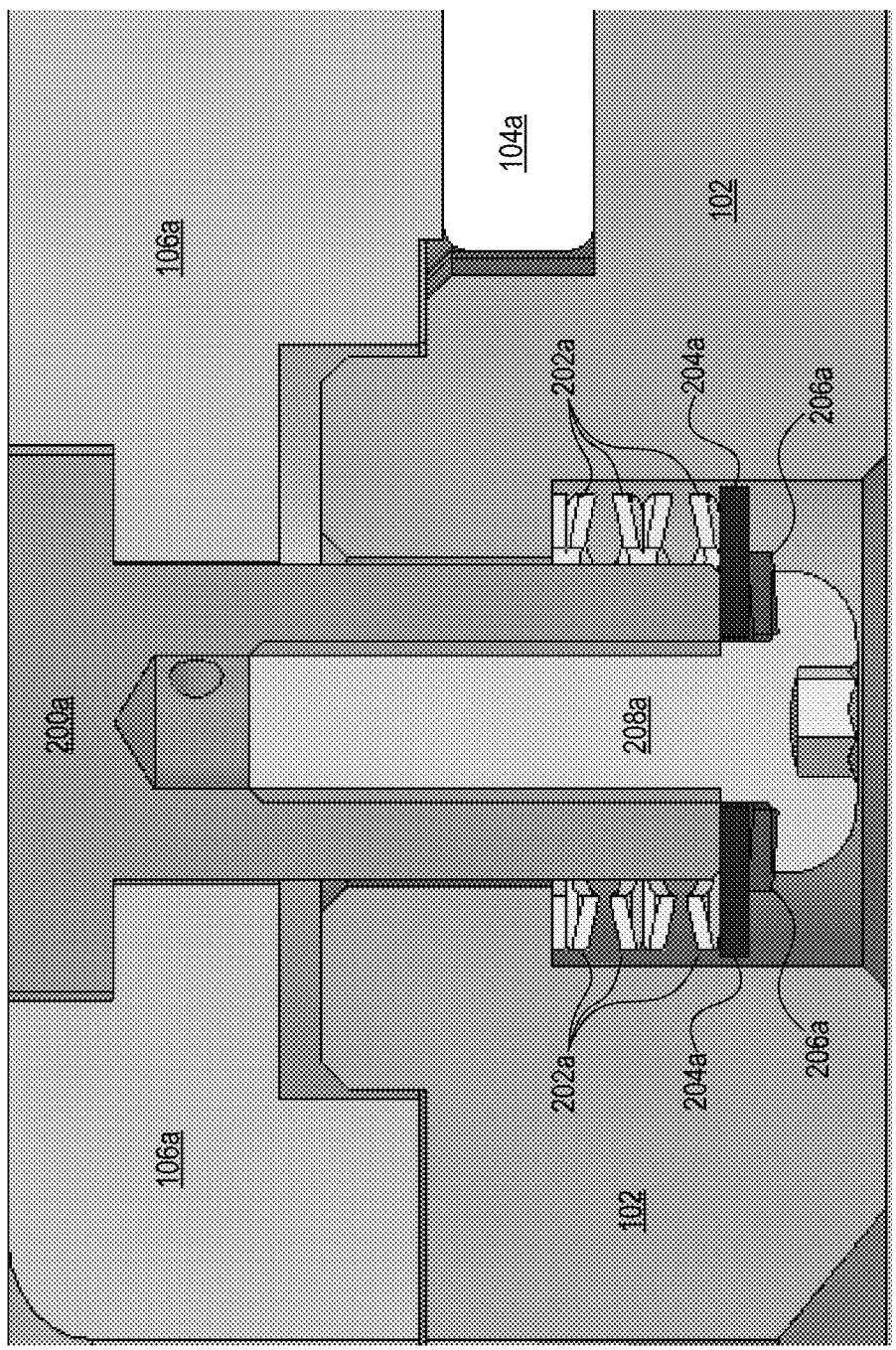
FIG. 2B illustrates a close-up cross-section view showing the fastener assembly 108a as installed, in accordance with implementations of the disclosure.

FIG. 2B illustrates a close-up transverse cross-section view showing the fastener assembly 108a as installed, in accordance with implementations of the disclosure. As shown, the wave spring 202a fits around the lower end of the shaft of the barrel nut 200a. The wave spring 202a exerts force against the fender washer 204a, effectively pulling the barrel nut 200a downward and securing the cover 106a. Of course, a similar mechanism is provided with respect to the fastener assembly 108b.

Thus, the cover 106a keys into the hub body 102 and is clamped via wave springs. This decouples the clamping force on the end effector (paddle) from the fastener torque.

Furthermore, in some implementations the barrel nut, wave spring, fender washer, and belleville washer are each made of the same material, such as Inconel (e.g. Inconel 625 in some implementations). This eliminates CTE (coefficient of thermal expansion) differences in the fastener stack.

The present assembly allows for full torqueing of fasteners (e.g. about 35 in-lbf (about 4 nm) for Inconel 625).

The wave spring provides a large amount of compliance (e.g. about 0.050 inch (about 0.13 cm) for CTE differences (e.g. about 0.005" (about 0.013 cm) and tolerance stack-up.

An all Inconel fastener stack eliminates all relative axial movement due to CTE differences (due to different materials). This addresses the issue of fastener loosening via thread shearing from material expanding.

Clearances around the fastener stack in the hub body allow for compliance to transverse movement of the cover/clamp due to thermal expansion (due to temperature differences between the body cover/clamp). This addresses the problem of fastener loosening via transverse joint movement.

The provided wave spring provides a consistent clamping force that is decoupled from the clamping force of the fastener. This addresses the problem of fastener loosening via thread shearing from fastener clamping force.

Figure 2C:
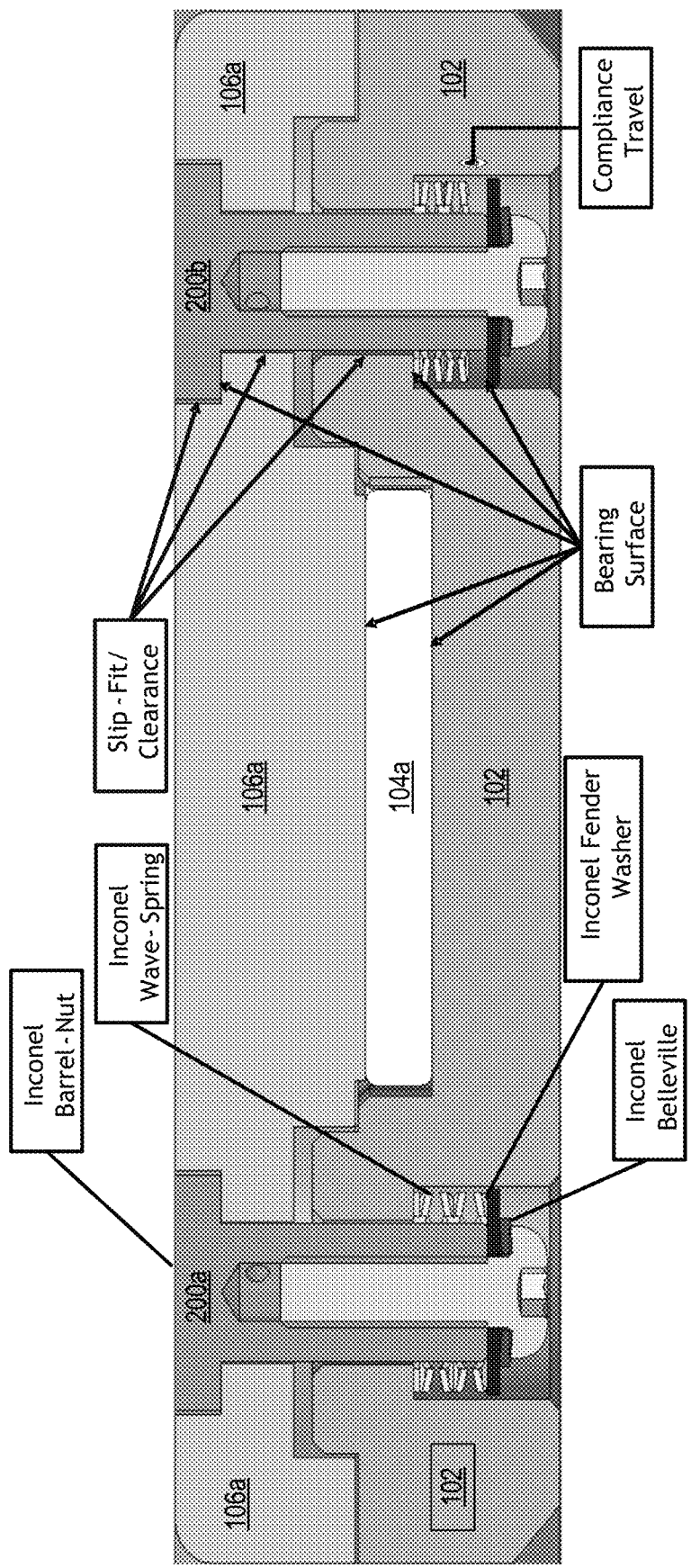
FIG. 2C illustrates a transverse cross-sectional view of a portion of the spindle assembly, in accordance with implementations of the disclosure.

FIG. 2C illustrates a transverse cross-sectional view of a portion of the spindle assembly, in accordance with implementations of the disclosure. The illustrated cross-section is vertically across the fastener assemblies 108a and 108b, and further shows the cover 106a, the end effector 104a and the hub body 102. In particular, bearing surfaces are indicated as shown.

Figure 2D:
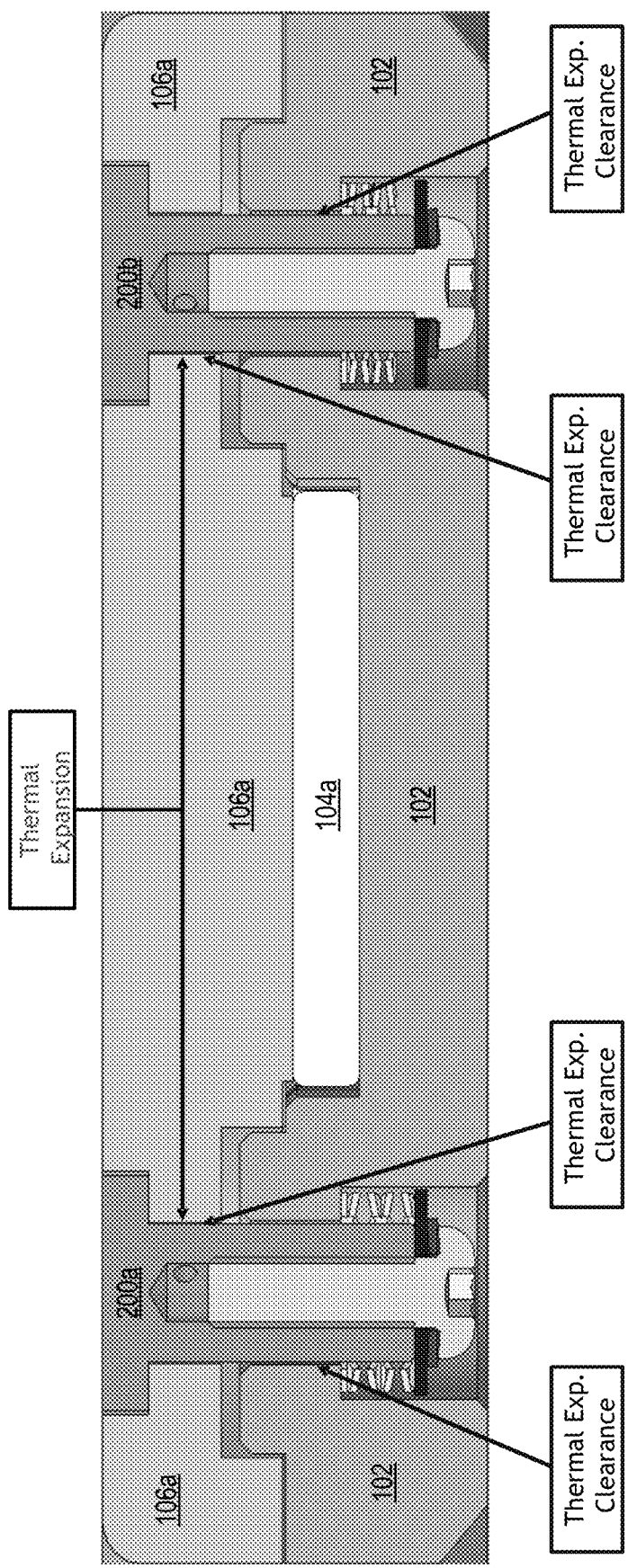
FIG. 2D illustrates a transverse cross-sectional view of a portion of the spindle assembly, in accordance with implementations of the disclosure.

FIG. 2D illustrates a transverse cross-sectional view of a portion of the spindle assembly, in accordance with implementations of the disclosure. The illustrated cross-section is vertically across the fastener assemblies 108a and 108b, and further shows the cover 106a, the end effector 104a and the hub body 102. In particular, the thermal expansion clearances around the barrel nuts 200a and 200b are indicated as shown. These provide tolerance for thermal expansion, such as thermal expansion of the cover 106a.

Figure 3:
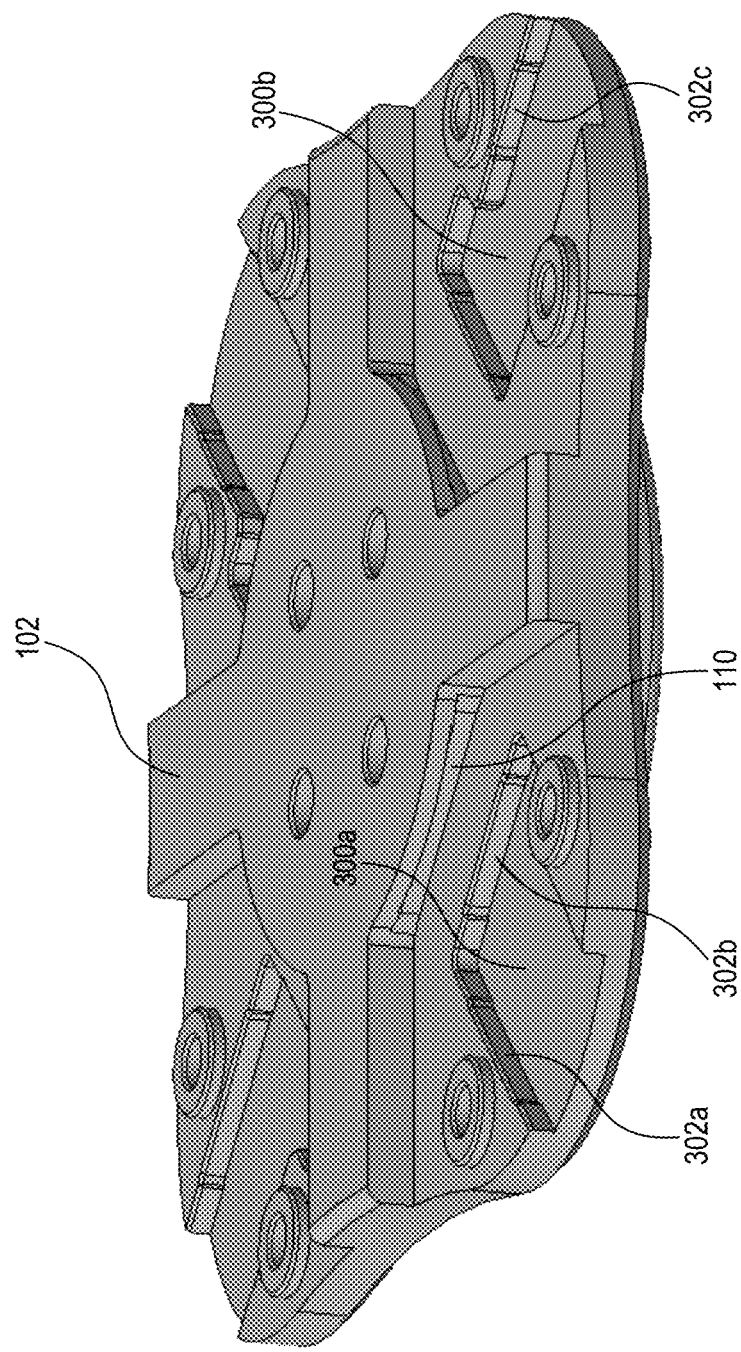
FIG. 3 illustrates a perspective view of the hub body 102, in accordance with implementations of the disclosure.

FIG. 3 illustrates a perspective view of the hub body 102, in accordance with implementations of the disclosure. As shown, the hub body 102 includes a pocket 300a that is configured to receive the internal end of the end effector 104a. Similarly, pockets are provided for each end effector, such as pocket 300b which is configured to receive the internal end of the end effector 104b. Each pocket is a recessed cutout along the top surface of the hub body, that is shaped to conform to the shape of the end effector's internal/proximal end.

The pockets include reliefs (e.g. reliefs 302a, 302b, 302c) to reduce sticking of the end effector's proximal end in the hub body 102 after cooling. As shown, the reliefs reduce the surrounding area of the pockets which contacts the end effector, thereby reducing sticking.

Also shown is the undercut 110, which as noted above provides a groove for the cover 106a to lock into.

FIG. 4A illustrates a top view of the cover 106a, in accordance with implementations of the disclosure. As shown, a lip 112 is included which fits into the undercut 110 of the hub body.

FIG. 4B illustrates a side view of the cover 106a, in accordance with implementations of the disclosure. As shown, the underside of the lip 112 is beveled to make it easier to fit the cover 106a into the undercut 110 of the hub body.

FIG. 4C illustrates a bottom view of the cover 106a, in accordance with implementations of the disclosure.

Figure 5:
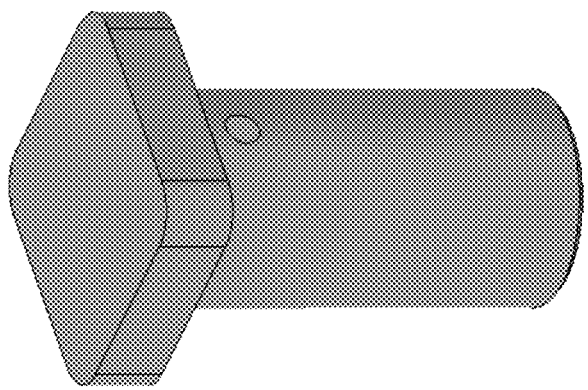
FIG. 5 illustrates a perspective view of a barrel nut, in accordance with implementations of the disclosure.

FIG. 5 illustrates a perspective view of a barrel nut, in accordance with implementations of the disclosure. An Inconel barrel nut is used to create an all Inconel fastener assembly to eliminate CTE differences. In some implementations the barrel nut is composed of Inconel 625.

Figure 6A:
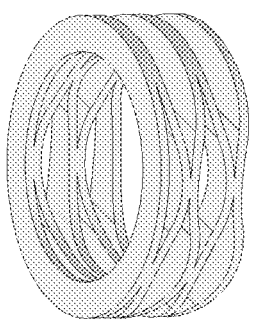
FIG. 6A illustrates a perspective view of a wave spring, in accordance with implementations of the disclosure.

FIG. 6A illustrates a perspective view of a wave spring, in accordance with implementations of the disclosure. A wave spring is used to provide clamping load on the end effector and compliance to the system to alleviate CTE & tolerance stack-up. In some implementations the wave spring is composed of Inconel X-750, Spring Temper.

Figure 6B:
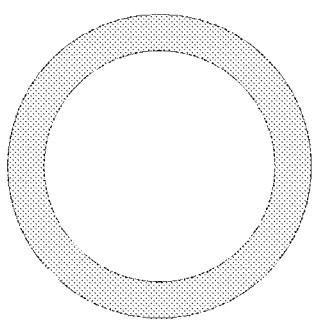
FIG. 6B illustrates a top view of a wave spring, in accordance with implementations of the disclosure.

FIG. 6B illustrates a top view of a wave spring, in accordance with implementations of the disclosure.

Figure 6C:
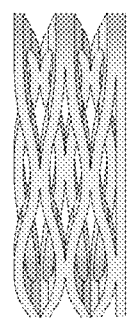
FIG. 6C illustrates a side view of a wave spring, in accordance with implementations of the disclosure.

FIG. 6C illustrates a side view of a wave spring, in accordance with implementations of the disclosure.

Figure 7A:
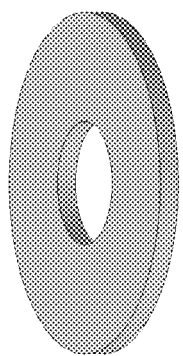
FIG. 7A illustrates a perspective view of a fender washer, in accordance with implementations of the disclosure.

FIG. 7A illustrates a perspective view of a fender washer, in accordance with implementations of the disclosure. A fender washer is used to create an all Inconel fastener assembly to eliminate CTE differences. In some implementations the fender washer is composed of Inconel 625.

Figure 7B:
FIG. 7B illustrates a top view of a fender washer, in accordance with implementations of the disclosure.

FIG. 7B illustrates a top view of a fender washer, in accordance with implementations of the disclosure.

Figure 7C:
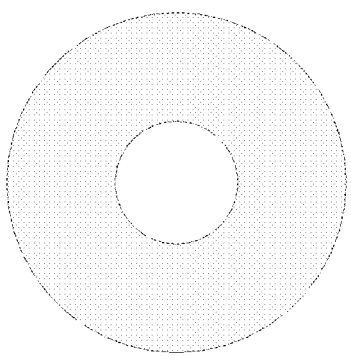
FIG. 7C illustrates a side view of a fender washer, in accordance with implementations of the disclosure.

FIG. 7C illustrates a side view of a fender washer, in accordance with implementations of the disclosure.

FIG. 8A illustrates a cutaway perspective view of the hub body 102, in accordance with implementations of the disclosure. Shown in cross section are spindle fastener assemblies 800a and 800b, which are configured to fasten the hub body 102 to an underlying spindle shaft assembly, which is operable to raise/lower and rotate the spindle assembly 100. In various implementations there can be two or more spindle fastener assemblies. In the illustrated implementation there are a total of four spindle fastener assemblies.

FIG. 8B illustrates an expanded perspective view of the components of the spindle fastener assembly 800a, in accordance with implementations of the disclosure. As shown, the spindle fastener assembly 800a includes a screw 802, a flat washer 804, a belleville washer 806, a belleville washer 808, and a flat washer 810. Each of these components can be composed of Inconel (e.g. Inconel 625). The provided configuration of the spindle fastener assembly adds compliance to allow for relative movement due to different CTEs.

Figure 9B:
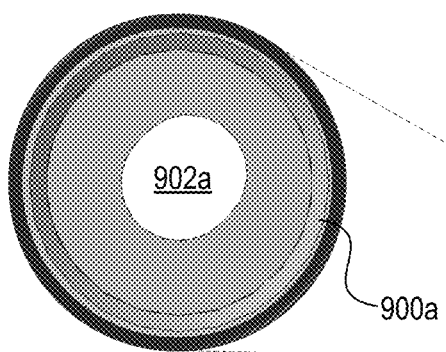
FIG. 9B illustrates an expanded top view of the through hole 900a, in accordance with implementations of the disclosure.
Figure 9A:
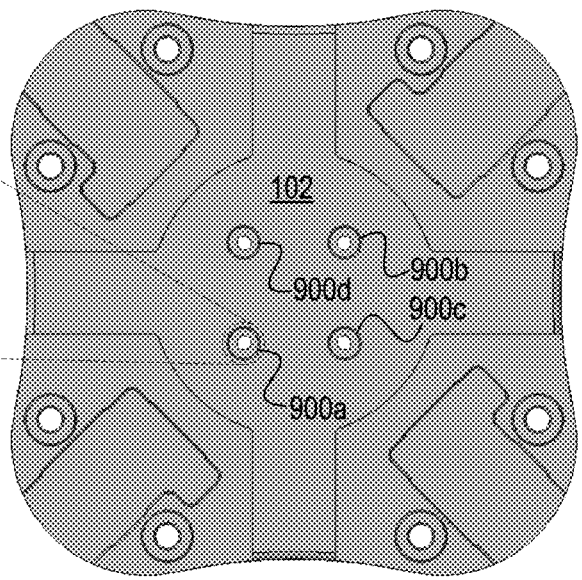
FIG. 9A illustrates a top view of the hub body 102, in accordance with implementations of the disclosure.

FIG. 9A illustrates a top view of the hub body 102, in accordance with implementations of the disclosure. Shown in the illustrated implementation are several through holes 900a, 900b, 900c, and 900d through which the above-described spindle fastener assemblies are respectively inserted. For example, the spindle fastener assemblies 800a and 800b may be inserted into, and extend through, the through holes 900a and 900b, respectively.

FIG. 9B illustrates an expanded top view of the through hole 900a, in accordance with implementations of the disclosure. The through hole 900a includes a spindle clearance hole 902a (through which the threaded portion of the screw 802 passes). The spindle clearance hole 902a is configured as a slot extending in a radial direction relative to center of the hub body 102. In other words, the spindle clearance hole 902a does not have a perfectly circular cross-sectional shape, but is extended radially away (or towards) the center of the hub body 102, having an oblong or slot shaped cross-sectional shape. Each of the other through holes is similarly configured with a spindle clearance hole configured as a slot. This configuration of the spindle clearance holes as slots addresses radial movements due to CTE differences.

Figure 9D:
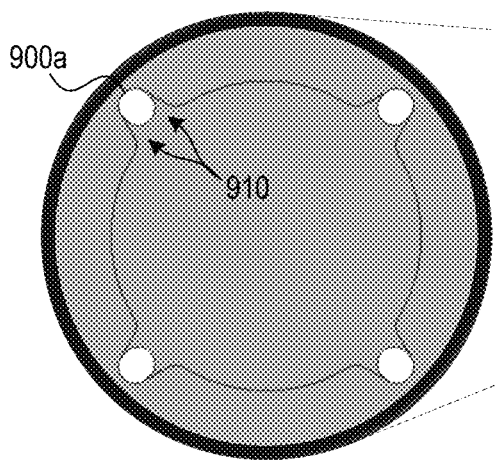
FIG. 9D illustrates an expanded bottom view of a center portion of the hub body 102, in accordance with implementations of the disclosure.
Figure 9C:
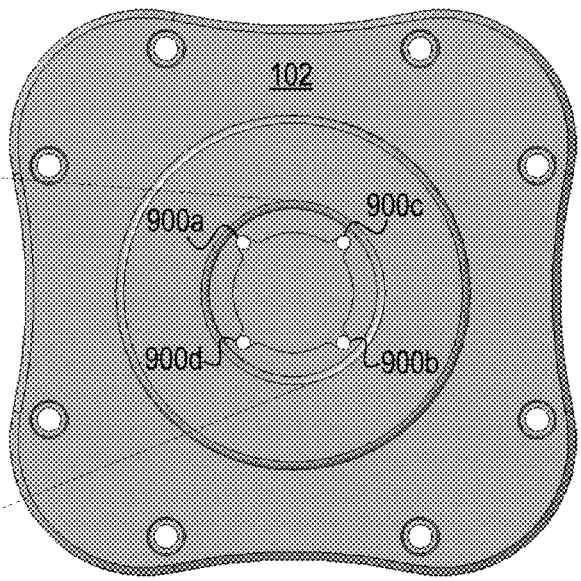
FIG. 9C illustrates a bottom view of the hub body 102, in accordance with implementations of the disclosure.

FIG. 9C illustrates a bottom view of the hub body 102, in accordance with implementations of the disclosure. Visible in the illustrated implementation are the through holes 900a, 900b, 900c, and 900d seen from the underside of the hub body 102.

FIG. 9D illustrates an expanded bottom view of a center portion of the hub body 102, including the through holes, and showing the radial slot shape of the spindle clearance holes. Material has been removed from regions around the spindle screws (e.g. screw 802). For example, in the region shown at reference 910, material has been removed along the interior portion of the spindle clearance hole 902a. Similar configuration is shown for the remaining sinpdle clearance holes.

This removal of material prevents deformation and subsequent swaging of the hub to the spindle.

Figure 10:
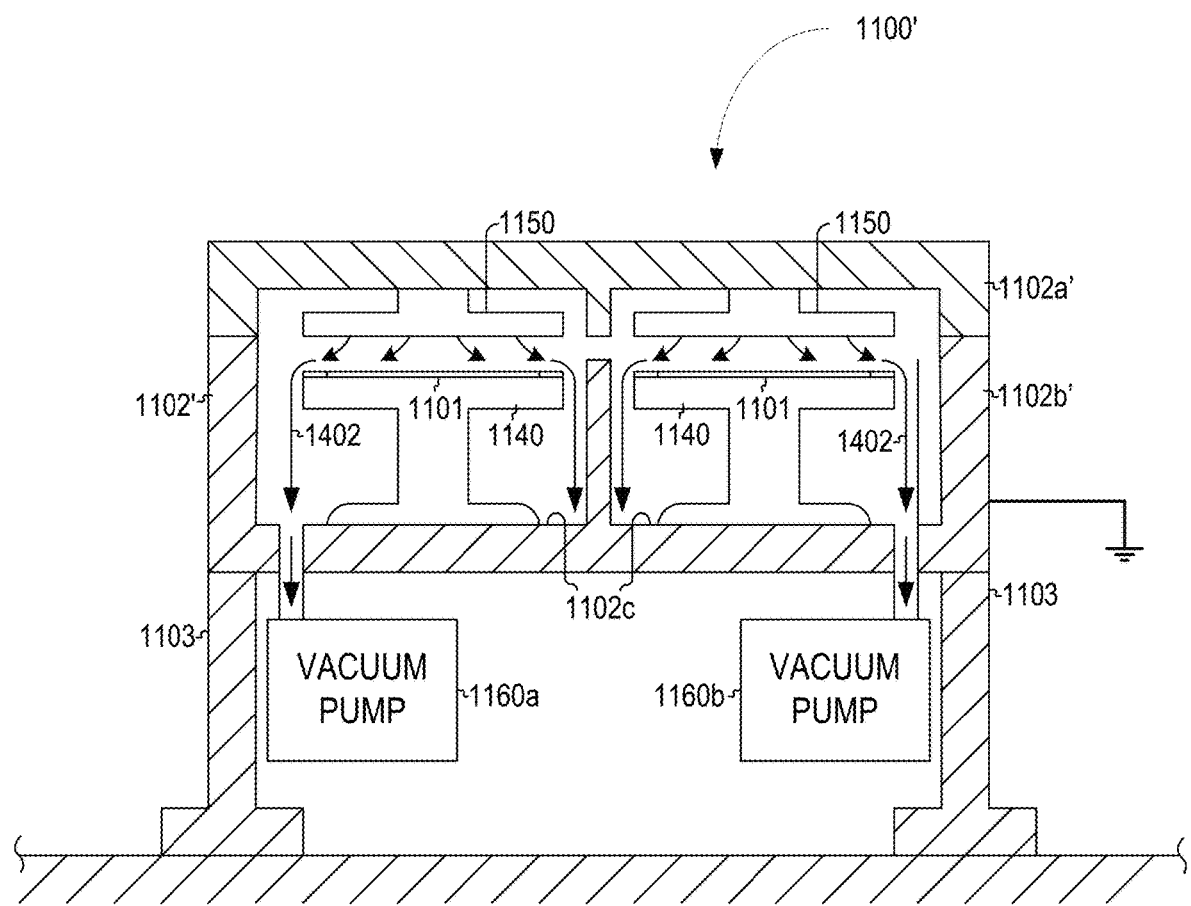
FIG. 10 illustrates a cross-sectional view of a substrate processing system 1100' that engages multiple stations, in accordance with implementations of the disclosure.

FIG. 10 illustrates a cross-sectional view of a substrate processing system 1100' that engages multiple stations, in accordance with implementations of the disclosure. The process chamber 1102' includes a lower chamber portion 1102b' that houses multiple stations and an upper chamber portion 1102a' that houses multiple showerheads 1150. The number of showerheads 1150 in the upper chamber portion 1102a' equals the number of stations disposed in the lower chamber portion 1102b'. The upper chamber portion 1102a' is configured to lower the showerheads 1150, such that the showerheads 1150 are substantially aligned over the pedestal 1140 of each station. The lower chamber portion 1102b' is configured to be supported by a support structure 1103. The support structure 1103 may be defined by any suitable structure capable of supporting the multi-station process chamber 1102', as well as facilities utilized to provide gases, RF power, pressure control, temperature control, timing, and associated controller and electronics. In one embodiment, the support structure 1103 is defined from a metal tubular structure, which supports the process chamber 1102' above a surface (e.g., clean room floor) in which the process chamber 1102' of the substrate processing system 1100' is installed. Vacuum pumps 1160a, 1160b are provided and interfaced with the lower chamber portion 1102b'. The vacuum pumps 1160a, 1160b, are configured to provide for sufficient gas flow, remove process gases and/or provide pressure controls within the process chamber 1102'. Typically, the process gases are allowed to flow over the substrate 1101 and over the edges of pedestals 1140 toward the vacuum pumps 1160a, 1160b, thus defining gas flow paths 1402.

Figure 11B:
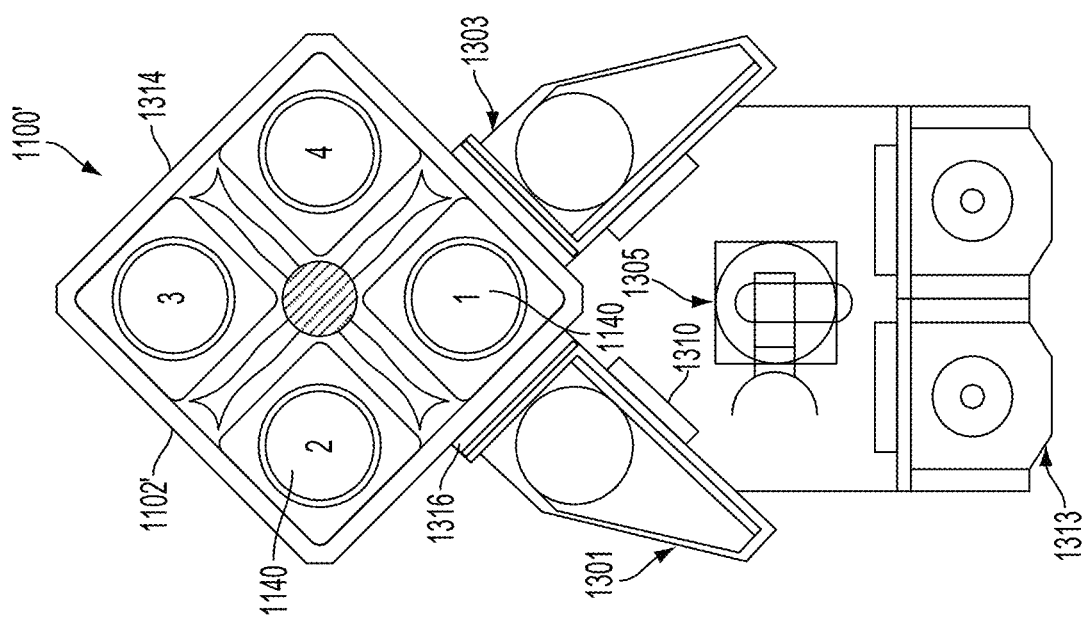
FIG. 11B shows a schematic view of an embodiment of a multi-station substrate processing system with an inbound load lock and an outbound load lock, in accordance with implementations of the disclosure.
Figure 11A:
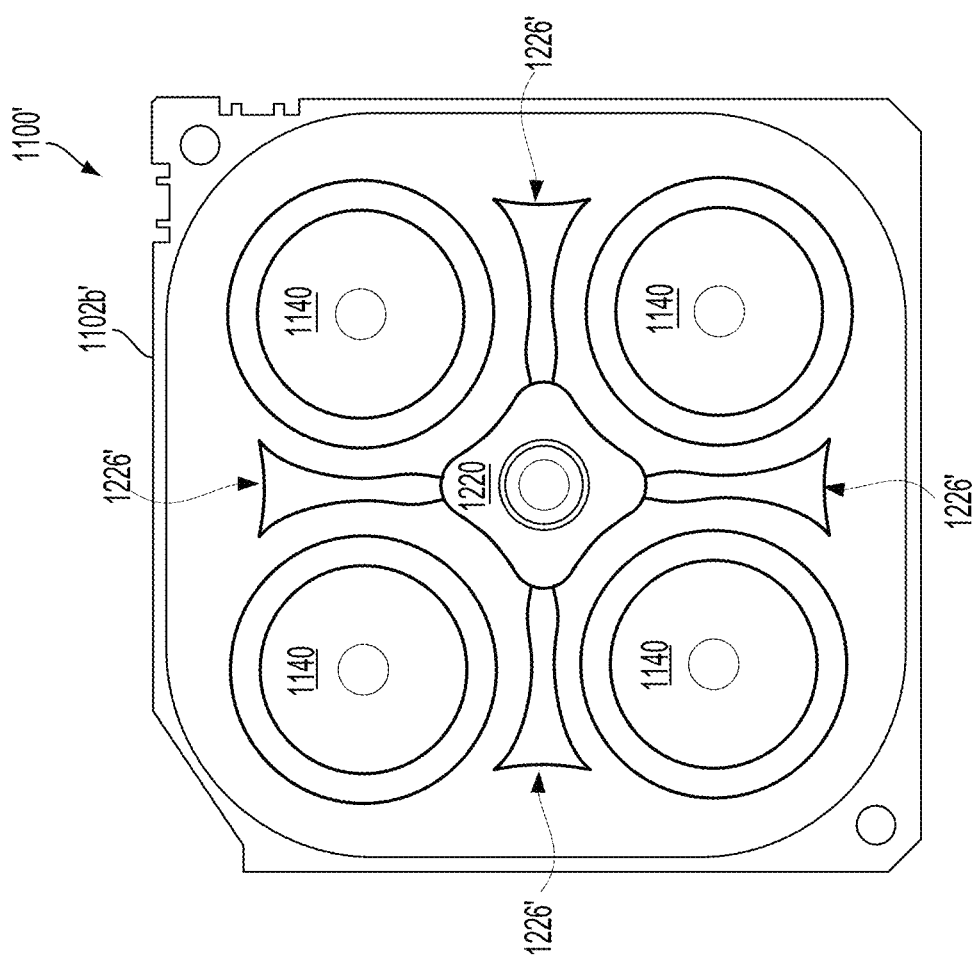
FIG. 11A illustrates a top view of a multi-station substrate processing system 1100', wherein four processing stations are provided in a process chamber, in accordance with implementations of the disclosure.

FIG. 11A illustrates a top view of a multi-station substrate processing system 1100', wherein four processing stations are provided in a process chamber 1102'. This top view is of the lower chamber portion 1102b' (e.g., with the upper chamber portion 1102a' removed for illustration) of the process chamber 1102'. The four stations are accessed by a lifting mechanism that engages end effectors 1226'. The end effectors are coupled to a rotating mechanism 1220. The end effectors, when engaged, are configured to move under wafers and lift the wafers from the stations simultaneously, and then rotate at least one or more stations before lowering the wafers to a next location so that further plasma processing, treatment and/or film deposition can take place on respective wafers.

FIG. 11B shows a schematic view of an embodiment of a multi-station substrate processing system 1100' with an inbound load lock 1301 and an outbound load lock 1303. A robot 1305, at atmospheric pressure, is configured to move wafers from a cassette loaded through a pod 1313 into inbound load lock 1301 via an atmospheric port 1310. Inbound load lock 1301 is coupled to a vacuum source (not shown) so that, when atmospheric port 1310 is closed, inbound load lock 1301 may be pumped down. Inbound load lock 1301 also includes a chamber transport port 1316 interfaced with process chamber 1102'. Thus, when chamber transport 1316 is opened, another robot (not shown) may move a wafer from inbound load lock 1301 to a pedestal 1140 of a first process station disposed in the lower chamber portion 1102b', for processing.

The depicted process chamber 1102' comprises four process stations, numbered from 1 to 4 in the embodiment shown in FIG. 2B. In some embodiments, process chamber 1102' may be configured to maintain a low pressure environment so that wafers may be transferred among the process stations without experiencing a vacuum break and/or air exposure. Each process station depicted in FIG. 11B includes a pedestal 1140 to receive a wafer and process gas delivery line inlets (not shown).

In the configuration of FIGS. 11A and 11B, no grounding plate is provided around each of the pedestals. As such, the lower chamber body is left exposed and the RF ground return is usually via chamber walls. This configuration does not provide any symmetry for RF ground return. In an alternate embodiment, a grounding plate may be included to provide symmetric RF ground return.

The lifting mechanism includes end effectors 1226' attached to the rotating mechanism 1220. In some embodiments, the rotating mechanism 1220 is a spindle that is operated by a spindle motor (not shown).

When the wafers have to be moved, lift pins are engaged using a lift pin control. The lift pins lift the wafer from the pedestal 1140. The end effectors (also known as wafer blades or wafer paddles) move under the wafers and life the wafers off of the lift pins. The lift pins retract into the housing, and the spindle and the end effectors rotate the wafers to the next pedestal 1140. The lift pins are once again engaged to receive the wafers off the end effectors. The end effectors and the spindle are rotated out of the way and the wafers are received on the pedestals 1140. The transferring of the wafers are coordinated so that the wafers are positioned on different pedestals to allow further processing of the wafers. In the illustrated embodiment, the lift pins are strategically disposed in a body of the pedestal so as to not hinder with the movement of the end effectors, when the lift pins are engaged.

Figure 12:
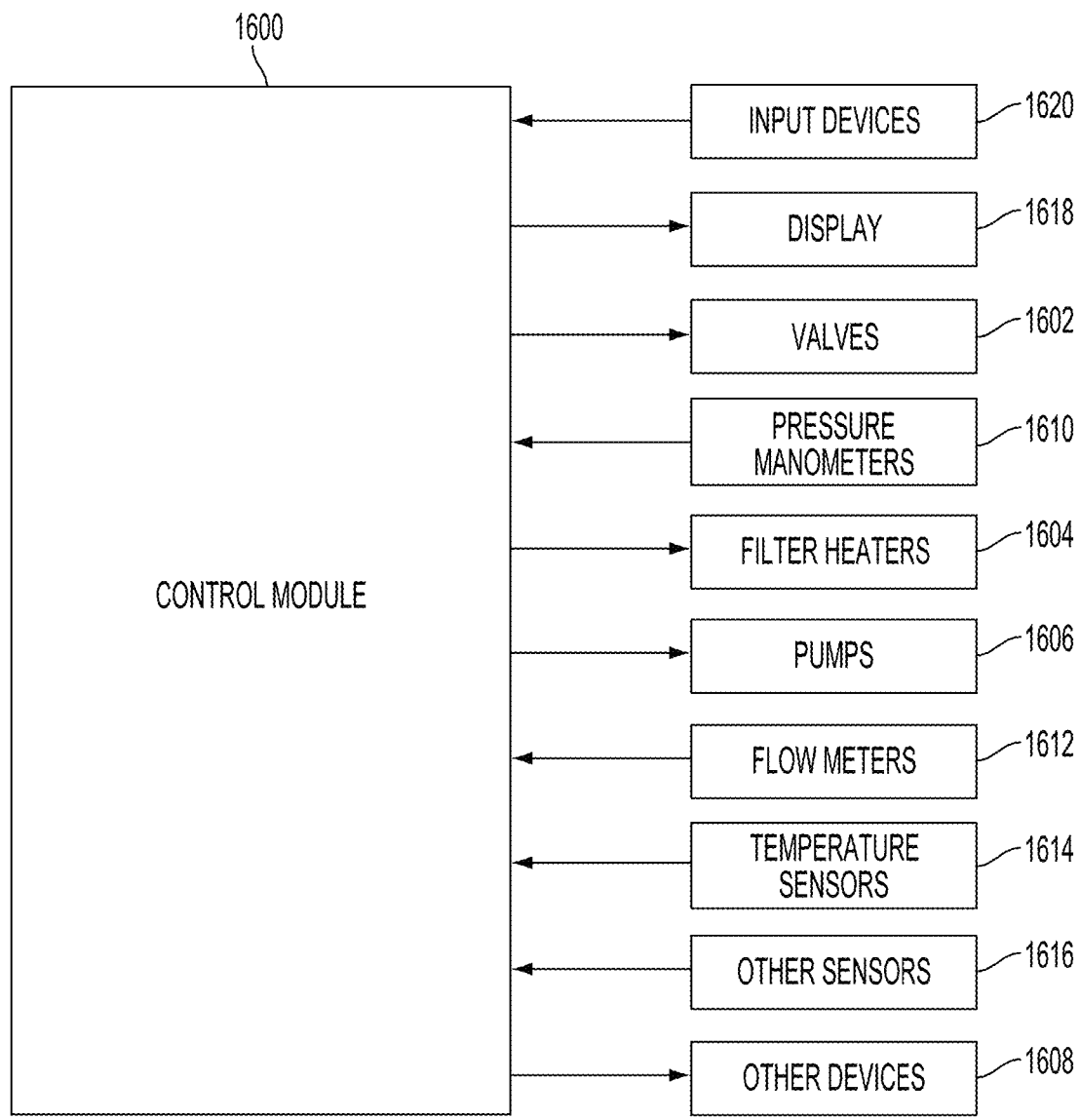
FIG. 12 shows a control module 1600 for controlling the systems of the present disclosure, in accordance with implementations of the disclosure.

FIG. 12 shows a control module 1600 for controlling the systems described above. For instance, the control module 1600 may include a processor, memory and one or more interfaces. The control module 1600 may be employed to control devices in the system based in part on sensed values. For example only, the control module 1600 may control one or more of valves 1602, filter heaters 1604, pumps 1606, and other devices 1608 based on the sensed values and other control parameters. The control module 1600 receives the sensed values from, for example only, pressure manometers 1610, flow meters 1612, temperature sensors 1614, and/or other sensors 1616. The control module 1600 may also be employed to control process conditions during precursor delivery and deposition of the film. The control module 1600 will typically include one or more memory devices and one or more processors.

The control module 1600 may control activities of the precursor delivery system and deposition apparatus. The control module 1600 executes computer programs including sets of instructions for controlling process timing, delivery system temperature, pressure differentials across the filters, valve positions, mixture of gases, chamber pressure, chamber temperature, wafer temperature, radio frequency (RF) power levels, wafer chuck or pedestal position, and other parameters of a particular process. The control module 1600 may also monitor the pressure differential and automatically switch vapor precursor delivery from one or more paths to one or more other paths. Other computer programs stored on memory devices associated with the control module 1600 may be employed in some embodiments.

Typically there will be a user interface associated with the control module 1600. The user interface may include a display 1618 (e.g. a display screen and/or graphical software displays of the apparatus and/or process conditions), and user input devices 1620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 1610, and thermocouples located in delivery system, the pedestal or chuck (e.g. the temperature sensors 1614). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A spindle assembly for transferring wafers in a multi-station process module, comprising:
   a hub body, the hub body configured to be rotated about a center axis;
   a plurality of end effectors, each end effector having a first end configured for connection to the hub body and a second end configured to support a wafer;
   a plurality of covers; and
   a plurality of fastener assemblies;
   wherein the first end of each end effector is clamped between a respective cover and a respective outer portion of the hub body by a respective fastener assembly comprising a flat washer and a wave spring that is disposed between the hub body and the flat washer and that provides a consistent clamping force; and
   wherein respective fastener assembly comprises the following arranged in the following order: a barrel nut, the wave spring, the flat washer, a Belleville washer, and a screw.

2. The spindle assembly of claim 1, wherein the barrel nut extends through the respective cover and the respective outer portion of the hub body, and wherein the screw connects to the barrel nut.

3. The spindle assembly of claim 1, wherein the wave spring surrounds the barrel nut.

4. The spindle assembly of claim 1, wherein the wave spring decouples torque applied to the screw from clamping force applied by the respective fastener assembly to the respective cover and the respective outer portion of the hub body.

5. The spindle assembly of claim 1, wherein a lip of the respective cover is configured to fit into an undercut portion of the hub body.

6. The spindle assembly of claim 1, wherein the plurality of fastener assemblies are composed of an Inconel material.

7. The spindle assembly of claim 1, wherein the hub body includes a plurality of slot-shaped holes facilitating connection of the hub body to a rotating spindle shaft assembly.

8. A spindle assembly for transferring wafers in a multi-station process module, comprising:
   a hub body, the hub body configured to be rotated about a center axis;
   a plurality of end effectors, each end effector having a first end configured for connection to the hub body, the hub body having recesses configured to receive the first ends of the end effectors, each end effector having a second end configured to support a wafer during transfer in the multi-station process module; and
   a plurality of covers, each cover disposed over one of the first ends of the end effectors, each cover being fastened to the hub body by at least two fastener assemblies, so that the first end of each end effector is clamped between one of the covers and the hub body;
   wherein each fastener assembly comprises a flat washer and a wave spring that is disposed between the hub body and the flat washer and that provides a substantially consistent clamping force; and
   wherein the each fastener assembly comprises the following arranged in the following order: a barrel nut, the wave spring, the flat washer, a Belleville washer, and a screw.

9. The spindle assembly of claim 8, wherein the barrel nut extends through one of the covers and the hub body, and wherein the screw connects to the barrel nut.

10. The spindle assembly of claim 8, wherein the wave spring surrounds the barrel nut.

11. The spindle assembly of claim 8, wherein the wave spring decouples torque applied to the screw from clamping force applied by a respective fastener assembly to the one of the covers and the hub body.

12. The spindle assembly of claim 8, wherein each cover includes a lip that is configured to fit into an undercut portion of the hub body.

13. The spindle assembly of claim 8, wherein the fastener assemblies are composed of an Inconel material.

14. The spindle assembly of claim 8, wherein the hub body includes a plurality of slot-shaped holes facilitating connection of the hub body to a rotating spindle shaft assembly.

* * * * *